United States Patent [19]

Tsumori

[11] Patent Number: 5,208,133
[45] Date of Patent: May 4, 1993

[54] PHOTOSENSITIVE RESIN COMPOSITION

[75] Inventor: Toshiro Tsumori, Kanagawa, Japan

[73] Assignee: Sony Corporation, Tokyo, Japan

[21] Appl. No.: 700,469

[22] Filed: May 15, 1991

[30] Foreign Application Priority Data

May 15, 1990 [JP] Japan .................. 2-123000

[51] Int. Cl.$^5$ .......................................... G03H 7/038
[52] U.S. Cl. ................................ 430/270; 430/945; 522/67; 522/2
[58] Field of Search ................... 430/270, 945; 522/67, 522/2

[56] References Cited

U.S. PATENT DOCUMENTS 3,515,552  6/1970  Smith ........................ 522/67 X
4,113,497  9/1978  Schlesinger ................. 430/270

Primary Examiner—Cynthia Hamilton
Attorney, Agent, or Firm—Hill, Steadman & Simpson

[57] ABSTRACT

A photosensitive resin composition, which is a mixture of a base resin, an acid cross-linking agent and a photoreactive acid catalyst generator, is disclosed. The photoreactive acid catalyst generator contains tetrakis-1,2,4,5-(polyhalomethyl)benzene or tris(polyhalomethyl)benzene. The composition is a so-called three-component chemically amplified photoresist. When irradiated with an excimer laser light, the photoreactive acid generator is decomposed to yield a Lewis acid catalyst, while also yielding radicals, the photoreactive acid generator acting itself as an acid-linking auxiliary to improve the sensitivity of the photosensitive resin composition significantly. It becomes possible in this manner to form a fine resist pattern with superior resolution in the excimer laser lithography. On the other hand, the sensitivity dependency of the base resin or light transmittance may be lowered to increase the degree of freedom in material selection and designing.

12 Claims, No Drawings

PHOTOSENSITIVE RESIN COMPOSITION

BACKGROUND OF THE INVENTION

1. Field of the Invention

This invention relates to a photosensitive resin composition. More particularly, it relates to a photosensitive resin composition which may be used conveniently as a negative type photoresist for excimer laser lithography.

2. Description of the Prior Art

Recently, in keeping with the progress of VLSIs or ULSIs and with the miniaturization of the design rule of semiconductor devices, investigations for increasing the number of apertures of the light exposure apparatus, shortening the exposure light wavelengths and developing improved photoresist materials, have been conducted briskly in the field of photolithography. Above all, excimer laser lithography employing an excimer laser light source, such as KrF excimer laser light (248 nm), is attracting attention as the exposure light source in place of the conventional light source, such as g-line (436 nm) or i-line (365 nm) of the high pressure mercury lamps, as the technology for facilitated realization of a higher resolution in photo lithography.

Meanwhile, with the excimer laser lithography, it is difficult to make direct application of the novolak-based positive type photoresist which has been customarily employed for g-line or i-line exposures. The reason is that, since the novolak resin as the base resin and the aromatic rings of naphthoquinone diazide compounds added as the photo sensitive material exhibit high absorption in the wavelength range of the excimer laser light, sensitivity falls short, while transmissivity of the exposure light is also markedly lowered, thus resulting in a tapered cross-sectional shape of the photoresist pattern.

Under this situation, a demand has been raised for a photoresist material capable of realizing high sensitivity and high resolution in the excimer laser wavelength region. Recently, a so-called chemically amplified resist is attracting attention as this type of photoresist material. The chemically amplified resist is a photoresist of the type in which an acid catalyst is generated by an optical reaction from a photoreactive acid catalyst generator, referred to hereinafter as photoreactive acid generator, such as onium salt or polyhalogenide, and in which the resist reaction such as polymerization, cross-linking or functional group conversion, is proceeded by carrying out heat treatment in the presence of this acid catalyst, thereby causing changes in the rate of dissolution. The term "chemically amplified" is based on the fact that, since the change in the rate of dissolution is the catalytic reaction, the apparent quantum yield is high enough to produce a high sensitivity resist.

The chemically amplified resist is classified into a positive type resist and a negative type resist, depending on the type of the resist reaction, and into a two-component system and a three-component system, depending on the number of the basic components of the resist. Typical of this type of the resist is a negative type three-component system resist in which the novolak resin is used as the base resin, p, p'-dichlorodiphenyltrichloroethane (DDT) is used as the photoreactive acid generator and hexamethoxymethylmelamine is used as the acid-crosslinking agent.

However, the novolak resin suffers from a disadvantage that, since it exhibits higher absorption in the excimer laser wavelength region, as mentioned above, the resist film cannot be increased in thickness and thus the resin can not be applied to a monolayer resist process without considerable difficulties. For example, the resist film thickness capable of coping with the fine design rule of the order of 0.35 $\mu$m in terms of the gate electrode widths of MOS transistors is 0.5 $\mu$m at the maximum.

The present inventors have previously proposed a negative type two-component resist in which polyvinyl phenol having superior light transmitting properties is used as the base resin in place of the novolak resin and bis(polyhalomethyl) benzene is used as the photoreactive acid generator.

However, the above mentioned conventional chemically amplified resist leaves much to be desired.

For example, although it is possible with the negative type two-component system resist, previously proposed by the present inventors, to resolve the line and space widths each 0.3 $\mu$m highly satisfactorily when KrF excimer laser light exposure is made with the resist film thickness of 1 $\mu$m, a light exposure energy not less than 200 mJ/cm$^2$ is required, thus leaving much room for improvement in sensitivity in the excimer laser lithography.

On the other hand, with the above mentioned negative type three-component system resist, the KrF excimer laser light energy of 60 to 80 J/cm$^2$ is required for resolution for the assumed case of the heat treatment at 110° C. continuing for 90 seconds, so that further improvement in sensitivity is required of this resist for practical applications.

SUMMARY OF THE INVENTION

It is therefore a principal object of the present invention to provide a photosensitive resin composition with which it is possible to achieve high resolution and high sensitivity in excimer laser lithography.

As a result of our eager researches towards accomplishing the above object, the present inventors have found that, by employing a compound which itself has a cross-linking capability to some extent as the photoreactive acid generator and by mixing the compound into the base resin along with the acid cross-linking agent, a photosensitive resin composition exhibiting extremely high sensitivity and high resolution may be obtained.

The photosensitive resin composition of the present invention has been proposed on the basis of the above finding.

In accordance with the present invention, there is provided a photosensitive resin composition comprising a mixture of a base resin, an acid cross-linking agent and a photoreactive acid catalyst generator, wherein said photoreactive acid catalyst generator is tetrakis-1,2,4,5-(polyhalomethyl)benzene represented by the formula I

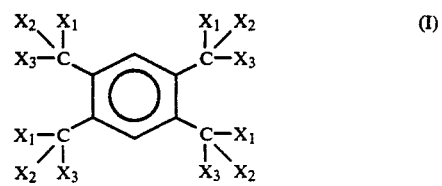

wherein $X_1$, $X_2$ and $X_3$ each represent a halogen atom or a hydrogen atom and at least one of $X_1$, $X_2$ or $X_3$ is a halogen atom.

According to a second aspect of the present invention, there is provided a photosensitive resin composition comprising a mixture of a base resin, an acid cross-linking agent and a photoreactive acid catalyst generator, wherein said photoreactive acid catalyst generator is tris(polyhalomethyl)benzene represented by the formula (II)

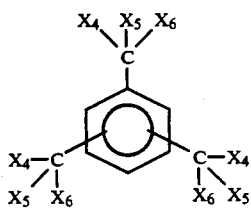

wherein $X_4$, $X_5$ and $X_6$ each represent a halogen atom or a hydrogen atom and at least one of $X_4$, $X_5$ or $X_6$ is a halogen atom.

According to a third aspect of the present invention, there is provided the photosensitive resin composition mentioned in the first aspect wherein said photoreactive acid catalyst generator is tris(bromomethyl)benzene wherein one of $X_1$, $X_2$, or $X_3$ in the formula I is a bromine atom and the other two are hydrogen atoms.

According to a fourth aspect of the present invention, there is provided the photosensitive resin composition mentioned in the second aspect wherein said photoreactive acid catalyst generator is tris(bromomethyl)benzene wherein one of $X_4$, $X_5$, or $X_6$ in the formula II is a bromine atom and the other two are hydrogen atoms.

According to a fifth aspect of the present invention, there is provided the photosensitive resin composition mentioned in the first and second aspects wherein said base resin is any one of cresol-novolak resin, polyvinylphenol or vinylphenol-methyl methacrylate copolymer.

According to a sixth aspect of the present invention, there is provided the photosensitive resin composition mentioned in the first and second aspects wherein said acid cross-linking agent is hexamethoxymethylmelamine.

According to a seventh aspect of the present invention, there is provided the photosensitive resin composition mentioned in the first and second aspects wherein said photoreactive acid catalyst generator and the acid cross-linking agent are contained in amounts of 0.1 to 10 parts by weight and 0.1 to 10 parts by weight, respectively, to 100 parts by weight of the base resin.

With the photosensitive resin composition of the present invention, the photosensitive acid generator is decomposed at the site irradiated by the excimer laser light to yield a Lewis acid catalyst, which then promotes the cross-linking reaction between the acid cross-linking agent and the base resin by the subsequent heating step to produce an alkali-insoluble region. On the other hand, halogen or benzyl radicals, produced upon light irradiation from the photoreactive acid generator, act on hydroxyl groups, for example, of the base resin. Thus the photoreactive acid generator itself shows the behavior as the cross-linking auxiliary which also contributes to the formation of the alkali-insoluble region. Since the photosensitive resin composition of the present invention has a substantially improved sensitivity by using the photoreactive acid generator exhibiting the cross-linking capability to some extent, the photoreactive acid generator as well as the acid cross-linking agent may be employed in reduced quantities, not only the photosensitive resin composition exhibiting higher light transmitting properties may be produced easily, but the base resin having intrinsically lower light transmitting properties may also be employed.

DETAILED DESCRIPTION OF THE INVENTION

As may be seen from the above formulas I and II, the photoreactive acid generator employed in the present invention is a tetra- or trifunctional compound showing itself some cross-linking properties so that it may be termed a cross-linking auxiliary. With this compound, at least one of $X_1$, $X_2$ or $X_3$ in the formula I or at least one of $X_4$, $X_5$ or $X_6$ in the formula II is a halogen atom, such as Cl or Br. Although a variety of derivatives are possible insofar as the chemical structure is concerned, such compound in which one of $X_1$, $X_2$ or $X_3$ in the formula I or one of $X_4$, $X_5$ or $X_6$ in the formula II is the halogen atom, is thought to be particularly useful, in view of ease in industrial manufacture or availability.

For example, tetrakis-1,2,4,5-halomethylbenzene employed in accordance with the first aspect of the present invention may be derived from pyromellitic acid, an anhydride of which is a starting material for preparing polyimides.

Although there are 1,2,3-, 1,2,4- and 1,3,5-isomers of trishalomethylbenzene, employed in the second aspect of the present invention, depending on the substituent positions on the benzene ring, these isomers may be derived from hemimellitic acid, trimellitic acid and trimesic acid, respectively.

The base resin may be selected from a wide range of base resin materials customarily employed in the field of photoresist. This may be said to be an advantage of the present invention over the conventional positive type photoresist in which the mechanism of insolubilization is based on the molecular interaction between the base resin and the photosensitive agent and the base resin may be selected only from a limited range of the resin materials. Since the inventive photosensitive resin composition is improved in sensitivity by using the photoreactive acid generator having a specific structure, it is possible to use the novolak resin which has not been thought to be useful because of the lower light transmittance in the excimer laser wavelength range. In addition, polyvinyphenol or vinylphenol-methyl methacrylate copolymer, exhibiting a higher light transmittance in the above mentioned wavelength range, may also be employed.

If polyvinylphenol is used, it is preferably hydrogenated for increasing light transmittance in the above mentioned wavelength range. It is also preferred that the molecular weight of the compound be not less than 4000 for realizing a sufficient sensitivity.

If a vinylphenol-methyl methacrylate copolymer is employed, it is practically preferred that the polymerization ratio of methyl methacrylate be lower than 50%, because, if otherwise, the light transmittance of the copolymer at the excimer laser wavelength is increased, but the resistance thereof to dry etching is correspondingly lowered.

It is noted that the above mentioned base resin be admixed with other resin components, such as methyl polymethacrylate.

There is no limitation to the types of the acid cross-linking agents and those customarily used in the art may be employed.

The mixing ratio of the base resin, photoreactive acid generator and the acid cross-linking agent in the photosensitive resin composition of the present invention is selected to be approximately in the ranges of 0.1 to 10 parts by weight of the photoreactive acid generator and 0.1 to 10 parts by weight of the acid cross-linking agent to 100 parts by weight of the base resin. If the amounts of the photoreactive acid generator or the acid cross-linking agent are less than the above ranges, satisfactory resolution cannot be realized due to insufficient sensitivity, whereas, if the amounts are more than the above ranges, satisfactory resolution similarly cannot be realized due to the excess photoreaction and excess cross-linking.

The photosensitive resin composition of the present invention exhibits satisfactory sensitivity in the excimer laser wavelength range. If the composition is applied as the photoresist material in the preparation of semiconductor devices, a photoresist pattern which exhibits well-defined sharp cross-sectional shape reflecting the photomask pattern despite lesser light energies, that is, the anisotropic cross-sectional shape, can be produced. The composition may also be applied to a monolayer resist process. In addition, since the base resin may be selected from a wider range of materials than in the conventional positive type photoresist material, the degree of freedom in material selection or designing may be increased.

The present invention will be hereinafter explained with reference to examples and comparative examples on the basis of the results of experiments.

EXAMPLE 1

The present example 1 is directed to a photosensitive resin composition containing, according to the first aspect of the present invention, a cresol-novolak resin as the base resin, hexamethoxymethylmelamine as the acid cross-linking agent and tetrakis-1,2,4,5-bromomethylbenzene, that is, a compound of the formula I where $X_1$ is Br, $X_2$ is H and $X_3$ is similarly H.

Three g of the cresol-novolak resin, 0.1 g of hexamethoxymethylmelamine, manufactured by Sumitomo Kagaku Co., Ltd. under the trade name of "Sumimal" and 0.1 g of tetrakis-1,2,4,5-bromomethylbenzene, manufactured by the Aldrich Inc., were dissolved in 10 ml of ethyl cellosolve acetate, and filtered by a membrane filter with a pore size of 0.2 μm. A silicon wafer, 5 inches in diameter, was processed by baking at 200° C. for one minute for dehydration. Then, for augmenting adhesiveness, the silicon wafer was contacted for one minute with a vapor of hexamethyldisilazane, yielded by nitrogen gas bubbling, for blocking superficial hydroxylgroups by way of a hydrophobic treatment.

The resulting resist solution was spin-coated on the above-processed silicon wafer, at 3000 rpm, and the wafer thus coated with the resist solution was pre-baked at 90° C. for 90 seconds to remove the solvent to form a resist layer. The thickness of the resist layer after drying was 0.7 μm. This film thickness is thicker than 0.5 μm which has been thought to be the limit value with the conventional positive type photoresist in achieving resolution of the fine patterns of the order of 0.35 to 0.4 μm.

The resulting wafer, on which the resist layer has been formed as described above, was exposed using a KrF excimer laser stepper having the numerical aperture of 0.37 and a coherency factor 0.5. Then, for carrying out cross-linking by a thermal reaction, the wafer was processed by post-exposure baking (PEB) at 110° C. for 90 seconds. The thus baked wafer was developed for four minutes using an alkaline developing solution consisting mainly of tetramethylammonium hydroxide (TMAH) (manufactured by Tokyo Oka Kogyo Company Ltd. under the trade name of NMD-W; TMAH concentration, 2.38%).

The wafer was observed with a scanning electron microscope. It was now ascertained that the line and space widths of 0.4 μm could be resolved with satisfactory sectional shape with a lower energy of light exposure of 12 mJ/cm$^2$.

EXAMPLE 2

The present example 2 is directed to a photosensitive resin composition in which, in accordance with the first aspect of the present invention, polyvinylphenol having locally maximum absorption in the vicinity of the wavelength of 250 nm is used as the base resin in place of the above mentioned cresol-novolak resin.

Three g of polyvinylphenol, 0.5 g of hexamethoxymethylmelamine and 0.1 g of tetrakis-1,2,4,5-bromomethylbenzene, manufactured by Aldrich Inc., were dissolved in 10 ml of ethyl cellosolve acetate to produce a resist solution similarly to example 1, and a resist layer was similarly formed on a wafer. The resulting wafer with the resist layer thereon was exposed to light under optimum conditions and developed.

Observation of the developed wafer revealed that the line and space widths of 0.35 μm have been resolved with a satisfactory cross-sectional shape with the reduced light exposure energy of 10 mJ/cm$^2$.

EXAMPLE 3

The present example 3 is directed to a photosensitive resin composition containing, according to the second aspect of the present invention, the cresol-novolak resin as the base resin, hexamethoxymethylmelamine as the acid cross-linking agent and tris-1,2,4-bromomethylbenzene where $X_4$ is Br, $X_5$ is H and $X_6$ is similarly H in the formula II.

A resist solution was prepared in the same way as in example 1 except using tris-1,2,4-bromomethylbenzene in place of tetrakis-1,2,4,5-bromoethylbenzene of example 1. A resist layer was similarly formed on a wafer. The wafer with the resist layer thereon was exposed to light under optimum conditions and developed.

Observation of the developed wafer revealed that the line and space widths of 0.35 μm could be resolved with a satisfactory cross-sectional shape with the reduced light exposure energy of 15 mJ/cm$^2$.

COMPARATIVE EXAMPLE 1

In the present comparative example 1, a resist solution similar to the resist solution of example 1 except not containing the acid cross-linking agent was prepared, and an experiment similar to that of example 1 was conducted.

In this case, the line and space widths of 0.4 μm could be resolved, thus demonstrating that tetrakis-1,2,4,5-bromomethylbenzene, used as the photoreactive acid generator, itself has the cross-linking capability. However, the light energy of exposure required for the experiment was as high as 250 mJ/cm$^2$, from which it was seen that the inclusion of the acid cross-linking agent is necessary at any rate to procure practical sensitivity.

COMPARATIVE EXAMPLE 2

In the present comparative example, a similar experiment was conducted using a negative type chemically amplified photoresist manufactured by Shiplay Micro Electronics Ltd. under the trade name of SAL 601. This known photoresist is a three-component resist in which novolak resin, DDT (p,p'-dichlorodiphenyltrichloroethane) and hexamethoxymethylmelamine are used as the base resin, photoreactive acid generator and the acid cross-linking agent, respectively.

Using this resist solution, a resist layer similar to that of example 1 was formed on a wafer. The resulting wafer with the resist layer thereon was exposed to light under optimum conditions and developed in the same way as in example 1.

It was found that the light exposure energy of 65 mJ/cm$^2$ was required for resolving the line and space widths of 0.4 μm with the use of the commercial chemically amplified photoresist, while the photoresist was evidently inferior in sensitivity to the composition of the examples 1 to 3.

What is claimed is:

1. A photosensitive resin composition, comprising a mixture of a base resin, an acid cross-linking agent and a photoreactive acid catalyst generator, wherein said base resin is any one of cresolnovolak resin, polyvinyl phenol or vinyl phenol-methyl methacrylate copolymer, and wherein the improvement resides in that
said photoreactive acid catalyst generator is tetrakis-1,2,4,5-(polyhalomethyl) benzene represented by the formula I

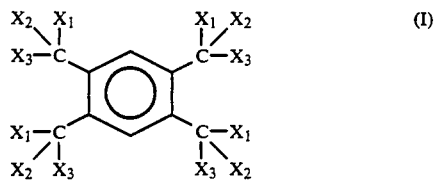

wherein $X_1$, $X_2$ and $X_3$ each represent a halogen atom or a hydrogen atom and at least one of $X_1$, $X_2$ or $X_3$ is a halogen atom.

2. The photosensitive resin composition according to claim 1 wherein said photoreactive acid catalyst generator is tetrakis-1,2,4,5-bromomethylbenzene wherein one of $X_1$, $X_2$ or $X_3$ in the formula I is a bromine atom and the other two are hydrogen atoms.

3. A photosensitive resin composition, comprising a mixture of a base resin, an acid cross-linking agent and a photoreactive acid catalyst generator, wherein said acid cross-linking agent is hexamethoxymethylmelamine, and wherein the improvement resides in that
said photoreactive acid catalyst generator is tetrakis-1,2,4,5-(polyhalomethyl) benzene represented by the formula I

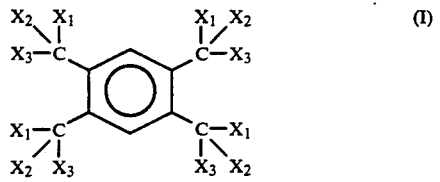

wherein $X_1$, $X_2$ and $X_3$ each represent a halogen atom or a hydrogen atom and at least one of $X_1$, $X_2$ or $X_3$ is a halogen atom.

4. The photosensitive resin composition of claim 3, wherein said photoreactive acid catalyst generator is tetrakis-1,2,4,5-bromomethylbenzene, wherein one of $X_1$, $X_2$, or $X_3$ in the formula (I) is a bromine atom and the other two are hydrogen atoms.

5. A photosensitive resin composition, comprising a mixture of a base resin, an acid cross-linking agent and a photoreactive acid catalyst generator, wherein said photoreactive acid catalyst generator and said acid cross-linking agent are contained in amounts of 0.1 to 10 parts by weight and 0.1 to 10 parts by weight, respectively, to 100 parts by weight of the base resin, and wherein the improvement resides in that
said photoreactive acid catalyst generator is tetrakis-1,2,4,5-(polyhalomethyl) benzene represented by the formula I

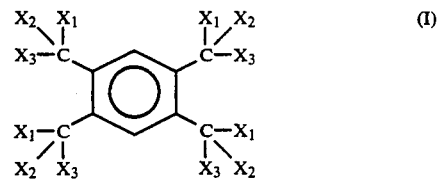

wherein $X_1$, $X_2$ and $X_3$ each represent a halogen atom or a hydrogen atom and at least one of $X_1$, $X_2$ or $X_3$ is a halogen atom.

6. The photosensitive resin composition of claim 5, wherein said photoreactive acid catalyst generator is tetrakis-1,2,4,5-bromomethylbenzene, wherein one of $X_1$, $X_2$, or $X_3$ in the formula (I) is a bromine atom and the other two are hydrogen atoms.

7. A photosensitive resin composition, comprising a mixture of a base resin, an acid cross-linking agent and a photoreactive acid catalyst generator, wherein said base resin is any one of cresol-novolak resin, polyvinyl phenol or vinylphenol-methyl methacrylate copolymer, and wherein the improvement resides in that
said photoreactive acid catalyst generator is tris(polyhalomethyl)benzene represented by the formula II

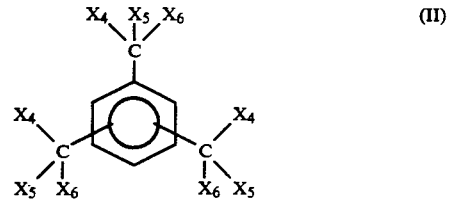

wherein $X_4$, $X_5$ and $X_6$ each represent a halogen atom or a hydrogen atom and at least one of $X_4$, $X_5$ or $X_6$ is a halogen atom.

8. The photosensitive resin composition according to claim 7 wherein said photoreactive acid catalyst generator is tris (bromomethyl)benzene wherein one of $X_4$, $X_5$ or $X_6$ in the formula (II) is a bromine atom and the other two are hydrogen atoms.

9. A photosensitive resin composition, comprising a mixture of a base resin, an acid cross-linking agent and a photoreactive acid catalyst generator, wherein said acid cross-linking agent is hexamethoxymethylmelamine, and wherein the improvement resides in that said photoreactive acid catalyst generator is tris(polyhalomethyl)benzene represented by the formula II

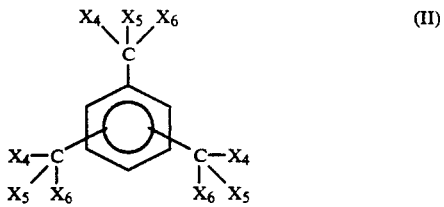 (II)

wherein $X_4$, $X_5$ and $X_6$ each represent a halogen atom or a hydrogen atom and at least one of $X_4$, $X_5$ or $X_6$ is a halogen atom.

10. The photosensitive resin composition of claim 9, wherein said photoreactive acid catalyst generator is tris(bromomethyl)benzene, wherein one of $X_4$, $X_5$, or $X_6$ in the formula (II) is a bromine atom and the other two are hydrogen atoms.

11. A photosensitive resin composition, comprising a mixture of a base resin, an acid cross-linking agent and a photoreactive acid catalyst generator, wherein said photoreactive acid catalyst generator and said acid cross-linking agent are contained in amounts of 0.1 to 10 parts by weight and 0.1 to 10 parts by weight, respectively, to 100 parts by weight of the base resin, and wherein the improvement resides in that said photoreactive acid catalyst generator is tris(polyhalomethyl)benzene represented by the formula II

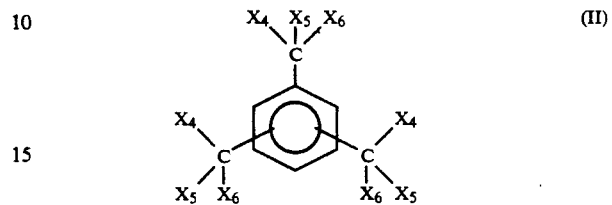 (II)

wherein $X_4$, $X_5$ and $X_6$ each represent a halogen atom or a hydrogen atom and at least one of $X_4$, $X_5$ or $X_6$ is a halogen atom.

12. The photosensitive resin composition of claim 11, wherein said photoreactive acid catalyst generator is tris(bromomethyl)benzene, wherein one of $X_4$, $X_5$, or $X_6$ in the formula (II) is a bromine atom and the other two are hydrogen atoms.

* * * * *